(12) United States Patent
Wu et al.

(10) Patent No.: US 12,347,704 B2
(45) Date of Patent: Jul. 1, 2025

(54) WAFER ALIGNMENT APPARATUS AND METHOD FOR MULTI-CASSETTE LOAD PORT

(71) Applicant: Taiwan Semiconductor Manufacturing Company, Ltd., Hsinchu (TW)

(72) Inventors: Cheng-Lung Wu, Zhunan (TW); Chih-Hung Huang, Hsinchu (TW); Yang-Ann Chu, Hsinchu (TW); Jiun-Rong Pai, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 629 days.

(21) Appl. No.: 17/694,838

(22) Filed: Mar. 15, 2022

(65) Prior Publication Data

US 2022/0399219 A1    Dec. 15, 2022

Related U.S. Application Data

(60) Provisional application No. 63/209,661, filed on Jun. 11, 2021.

(51) Int. Cl.
*H01L 21/67*    (2006.01)
*H01L 21/68*    (2006.01)

(52) U.S. Cl.
CPC ...... *H01L 21/67265* (2013.01); *H01L 21/681* (2013.01)

(58) Field of Classification Search
CPC . H01L 21/67265; H01L 21/67; H01L 21/681; H01L 21/68; H01L 21/67766;
(Continued)

(56) References Cited

U.S. PATENT DOCUMENTS 5,003,188 A * 3/1991 Igari ................. H01L 21/67265
                                             250/559.4
2008/0138178 A1* 6/2008 Ferrara ................... C23C 14/48
                                             414/757
(Continued)

FOREIGN PATENT DOCUMENTS

CN        1576202 A      2/2005
CN      101548361 A      9/2009
(Continued)

OTHER PUBLICATIONS

Chinese Office Action Dated: Jun. 28, 2024 Application No. 202210585108.6.
(Continued)

*Primary Examiner* — Nikolay K Yushin
(74) *Attorney, Agent, or Firm* — Lippes Mathias LLP

(57) ABSTRACT

A method of a handling semiconductor wafers in a space of a semiconductor wafer processing facility includes: loading a cassette containing at least one semiconductor wafer into a storage buffer of a load port; measuring, from within the storage buffer, a position of a selected at least one semiconductor wafer being retrieve from the cassette residing in the storage buffer; and determining, at least in part based on said measuring, a variation of the position of the selected semiconductor wafer from a nominal position.

20 Claims, 6 Drawing Sheets

(58) Field of Classification Search
CPC ............ H01L 21/677; H01L 21/67778; H01L 21/67763; H01L 21/6779
See application file for complete search history.

(56) References Cited

U.S. PATENT DOCUMENTS

| | | |
|---|---|---|
| 2009/0196588 A1 | 8/2009 | Nakagawa |
| 2014/0271083 A1 | 9/2014 | Caveney |
| 2014/0286733 A1 | 9/2014 | Ogura et al. |
| 2015/0071739 A1 | 3/2015 | Nakamura et al. |
| 2016/0078626 A1 | 3/2016 | Kodama et al. |
| 2018/0060525 A1 | 3/2018 | Chen et al. |
| 2019/0067040 A1 | 2/2019 | Kuo et al. |
| 2020/0388523 A1 | 12/2020 | Bonora et al. |

FOREIGN PATENT DOCUMENTS

| | | |
|---|---|---|
| JP | 2001015580 A | 1/2001 |
| JP | 2002252267 A | 9/2002 |
| JP | 2003100852 A | 4/2003 |
| JP | 2011134822 A | 7/2011 |
| JP | 2013246248 A | 12/2013 |
| JP | 2014170841 A | 9/2014 |
| JP | 2017120896 A | 7/2017 |
| JP | WO2019166906 A1 | 2/2021 |
| TW | 201912549 A | 4/2019 |
| TW | 202028096 A | 8/2020 |

OTHER PUBLICATIONS

Chinese Office Action for Application No. 2022105851086 Dated: Dec. 20, 2024.

\* cited by examiner

WAFER ALIGNMENT APPARATUS AND METHOD FOR MULTI-CASSETTE LOAD PORT

PRIORITY CLAIM AND CROSS-REFERENCE

This application claims the benefit of U.S. Provisional Patent Application No. 63/209,661, filed Jun. 11, 2021, which is incorporated by reference herein in its entirety.

BACKGROUND

The following relates to the semiconductor manufacturing arts, and in particular, to a method and apparatus for aligning semiconductor wafers during the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
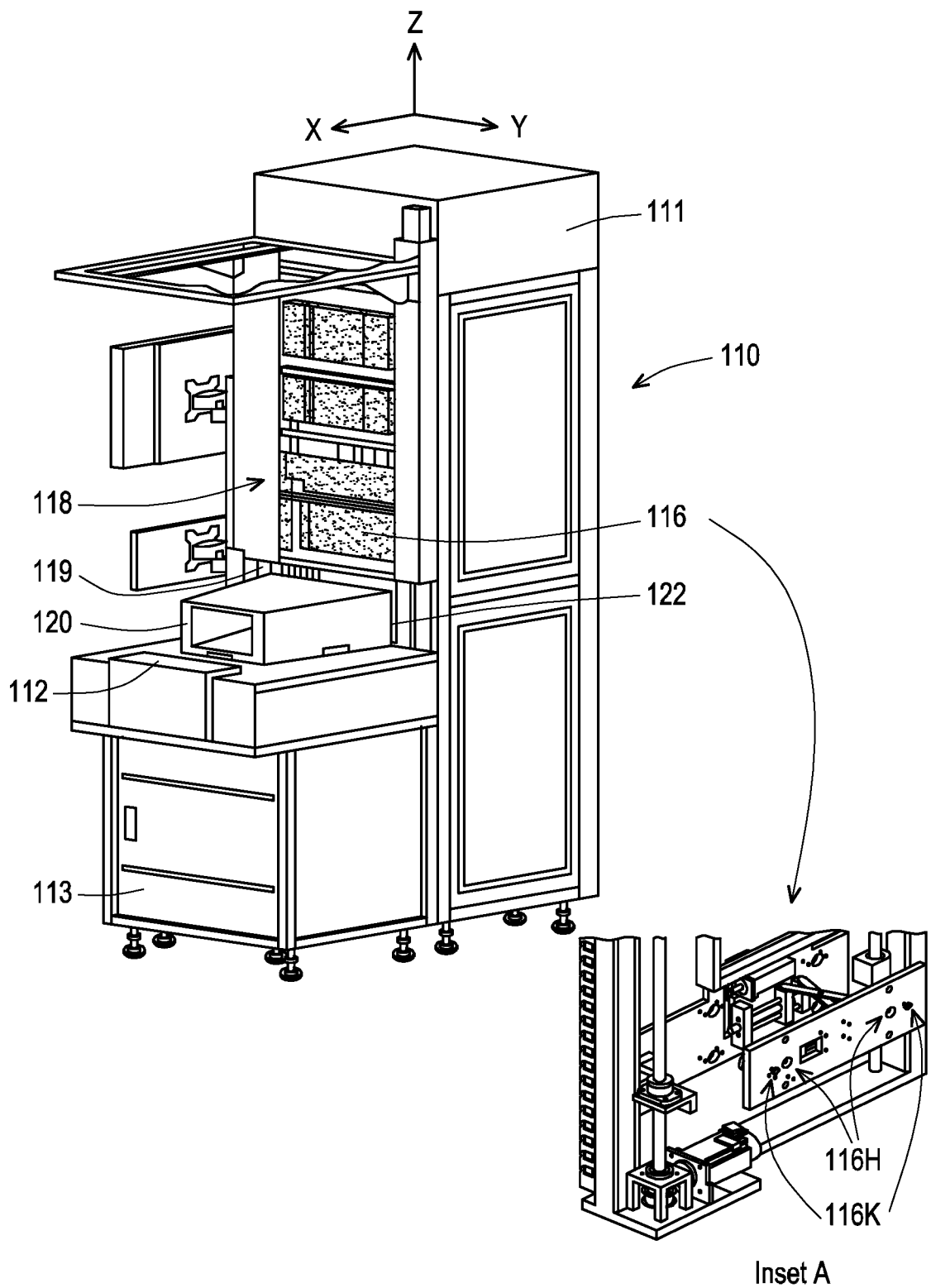
FIG. 1 diagrammatically illustrates a front perspective view of a multi-cassette load port apparatus in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices, e.g., such as Metal-Oxide-Semiconductor Field-Effect Transistor (MOS-FET) devices, Integrated Circuits (ICs), etc. are manufactured and/or fabricated from semiconductor wafers in a semiconductor fabrication plant, commonly referred to as a FAB or foundry. There are commonly many processing steps applied to the semiconductor wafer to produce a desired semiconductor device and/or numerous semiconductor devices on a wafer. For example, semiconductor fabrication can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer. Accordingly, a FAB clean room or other like space where fabrication takes place typically contains many individual pieces of machinery or tools for semiconductor device production, for example, without limitation, such as steppers and/or scanners for photolithography, in addition to tools for etching, cleaning, doping, testing, inspecting, staging, etc. During the fabrication process, a semiconductor wafer is commonly transported or transferred from tool to tool and/or otherwise loaded into various tools with a robotic arm or the like, e.g., an Equipment Front End Module (EFEM).

Some embodiments disclosed herein relate to a method and apparatus for aligning a semiconductor wafer being transferred from a Multi-Cassette Load Port (MCLP) apparatus to a chamber of a tool in which the semiconductor wafer is to be processed. One advantage of some embodiments disclosed herein is that the potential for damage to the semiconductor wafer caused by misalignments (for example, between tools and/or between a tool and the robot and/or EFEM handling the semiconductor wafer) is alleviated.

Significantly, in some embodiments, the hardware and/or mechanism(s) for measuring warpage and/or shifting of a semiconductor wafer are contained and/or housed within the MCLP apparatus itself, without any (or any appreciable) increase in the size of the MCLP apparatus. Accordingly, another advantage of some embodiments disclosed herein is that valuable floor space in a FAB clean room or other like space can be conserved, at least insomuch as some embodiments described herein do not add significantly to a collective footprint of the tools and/or machinery in the FAB space. Said another way, the extra footprint typically occupied by conventional mechanical alignment and/or positioning devices can be eliminated or reduced by employing instead some embodiments described herein.

In some embodiments, the FAB generally includes one or more floors, rooms or other like spaces having a plurality of process bays including processing, metrology, and inspection tools and semiconductor wafer staging equipment such as stockers which are interconnected by an Automated Material Handling System (AMHS), which is computer controlled for handling the staging of semiconductor wafers for processing and flow of wafer traffic in the FAB. Multiple wafers may be stored and transported together in wafer carriers (also referred to herein as cassettes) by the AMHS between load ports of different wafer processing or other tools during the semiconductor fabrication process. For example, the wafer carriers or cassettes may include standard mechanical interface (SMIF) pods which can hold a plurality of wafers (e.g., 200 mm diameter wafers), or front opening unified pods (FOUPs) which can hold a plurality of larger wafers, e.g., 300 mm or 450 mm diameter wafers. In practice, each wafer carrier may hold on the order of approximately 25 wafers, more or less.

In some embodiments, an overhead hoist transport (OHT) system is used to transport suitable wafer carriers or cassettes, such as FOUPs or SMIFs, from the load port of one tool to the load port of the next tool in the processing sequence. The OHT system suitably includes one or more vehicles (e.g., trollies, carts, carriages or the like) that travel on an overhead rail or other like track of the AMHS. A hoist, on-board the OHT vehicle, is operable to selectively raise and lower wafer carriers allowing the OHT vehicle to deposit and retrieve wafer carriers from the load ports of tools positioned along and/or on the floor beneath the overhead rail or track.

In some embodiments, the wafer carriers or cassettes transported by the OHT system have doors which remains closed during the transfer process, e.g., for production quality control. To improve production quality and reduce a demand for human intervention in the fabrication process, in some embodiments, the MCLP apparatus disclosed herein automatically opens and closes the door of the wafer carrier, and may selectively remove the door from the cassette and store the removed door in a door storage unit of a door storage system while the wafer carrier is loaded into a multi-cassette storage buffer of the MCLP apparatus.

In some embodiment, after a table or load port stage of the MCLP apparatus receives a cassette (e.g., from the OHT system or other like transfer tool), the MCLP apparatus has an opening mechanism to automatically open and/or remove the door of the cassette and move the door to a door storage unit of the MCLP apparatus for storing the door, while a controller of the MCLP apparatus controls the table or load port stage to move and/or load the opened wafer carrier into a buffering space of the multi-cassette storage buffer of the MCLP apparatus. Suitably, the MCLP apparatus may also have a closing mechanism to automatically retrieve a door from the storage unit and close the door onto a cassette returned to the table or the load port stage from the storage buffer. In practice, the retrieved door from the door storage unit may not be the original door that was on the cassette before it was loaded into the storage buffer, but may be the same model or type of door as the original door to suitably fit the wafer carrier returned to the table or stage from the storage buffer. Alternately, the disclosed apparatus can automatically map each wafer carrier to its particular door or door storage location; and automatically control the process flow including door opening, storing, and closing, e.g., to return a given door to its particular cassette. In either event, the MCLP apparatus can save human operation resources and reduce human errors on the manufacturing floor.

In some embodiments, the opening mechanism and the closing mechanism are coupled or combined together. The opening/closing mechanism and the door storage system may be installed on and/or incorporate with the MCLP apparatus that is located on a floor or in a space of the FAB. In practice, the opening/closing mechanism may include: a vacuum hole for applying suction to hold the door, a latch key to open/close the door, and a moving mechanism to selectively move the door to or from a door storage unit of the door storage system. In some embodiments, a door storage system may include one or more storage units each for storing a cassette door. The moving mechanism can fix the door to a door storage unit, e.g., by an alignment pin.

In some embodiments, the door storage units are covered by a transparent plate, such that an operator can see or view the doors therethrough. The MCLP apparatus may include a plurality of buffering spaces (e.g., in the multi-cassette storage buffer) to buffer a plurality of wafer carriers before any wafer in the buffered wafer carriers is processed further. Suitably, from the operator's point of view, the plurality of buffering spaces may be located at the back side of the wafer carrier, at the left side of the wafer carrier, or at the right side of the wafer carrier, according to various embodiments. Correspondingly, the table or load port stage may be configured to move the wafer carrier into a buffering space, from front to back, from left to right, or from right to left, according to various embodiments.

FIG. 1 illustrates an MCLP 110 in accordance with some embodiments of the present disclosure. As shown in FIG. 1, the MCLP apparatus 110 includes a multi-cassette storage buffer 111, a table or load port stage 112, a door opening/closing mechanism 116, and a door storage space or system 118.

Figure 3:
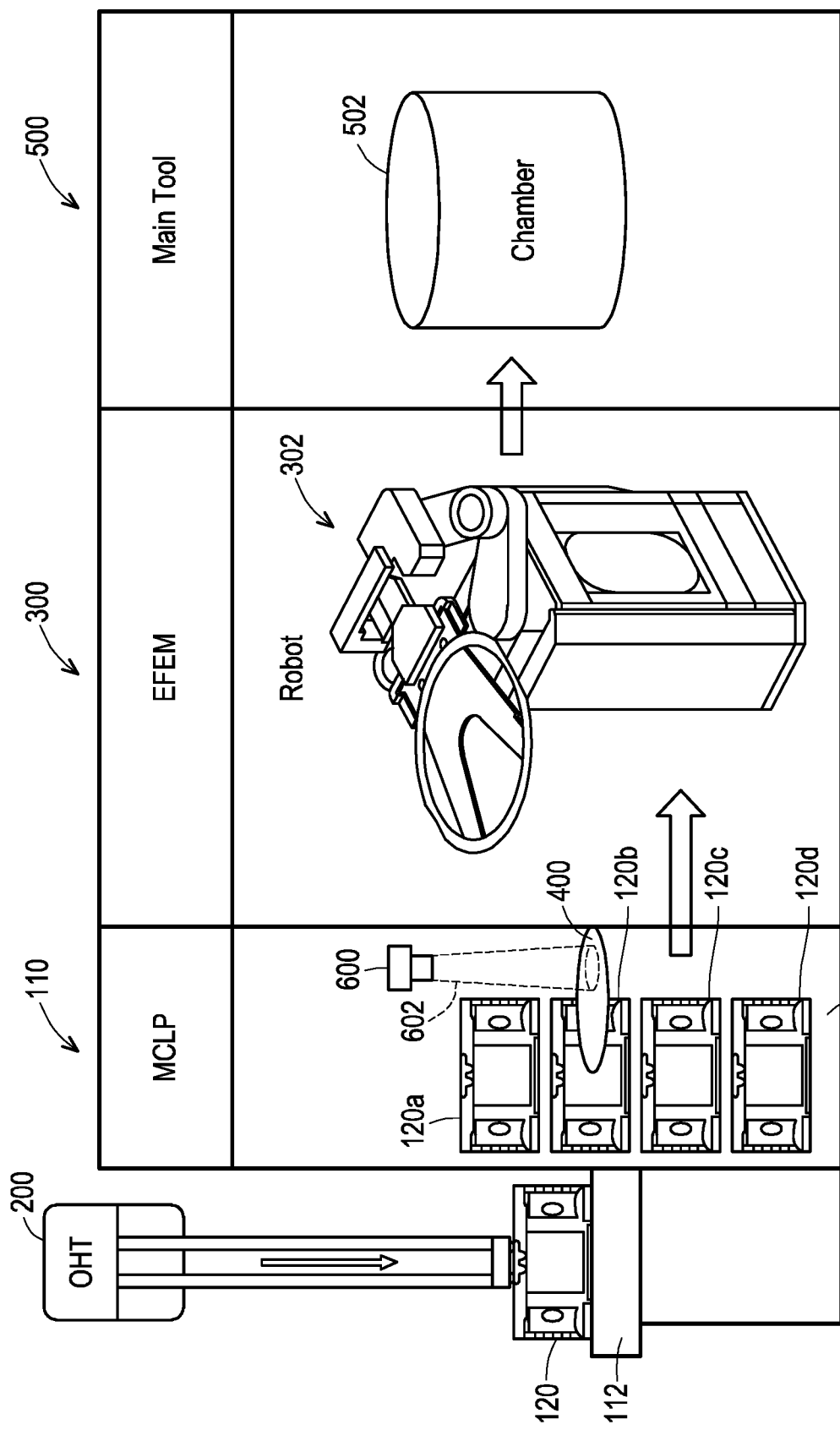
FIG. 3 diagrammatically illustrates a multi-cassette load port apparatus, equipment front end module and tool in accordance with some embodiments disclosed herein.

As shown in FIG. 1, the table or stage 112 is configured to receive a cassette 120 from a transport tool such as a vehicle of an OHT system (e.g., as shown in FIG. 3). In some embodiments, the vehicle 200 of the OHT system is physically coupled to a ceiling of the FAB and is located higher than the table or stage 112.

Suitably, the cassette 120 has a door 122 on the back thereof, i.e., on the side facing the storage buffer 111. As sown in FIG. 1, the door opening/closing mechanism 116 in this example is located at the front side of a housing of the storage buffer 111, i.e., at the side facing the wafer carrier 120. In practice, the door opening/closing mechanism 116 may be configured to open the door 122 of the cassette 120 (e.g., by a latch key 116K and vacuum hole 116H for applying a holding suction, as shown in Inset A of FIG. 1) and remove the door 122 from the cassette 120 (via a relatively short stroke motion) in a direction away from the cassette 120, i.e., in the −X direction as shown in FIG. 1. The door opening/closing mechanism 116 may then hold the door 122 and move it up (i.e., along the Z direction) to the door storage system 118.

As shown, the door storage system 118 in this example is arranged and/or situated on an outside of the housing of the multi-cassette storage buffer 111 and located at the front side of the housing, i.e., at the side facing the wafer carrier 120. In some embodiments, the door storage system 118 may be physically connected to the door opening/closing mechanism 116. In practice, the door opening/closing mechanism 116 is selectively movable relative to the door storage system 118, i.e., along the Z and −Z directions. As shown in FIG. 1, the door storage system 118 in this example includes four door storage units. Nevertheless, it is to be understood that the door storage system 118 may include one or more door storage units for selectively storing cassette doors. For example, after moving the door 122 up to one of the door storage units, the door opening/closing mechanism 116 may rotate a door pin by a suitable latch key to fix the door 122 into a selected door storage unit. Suitably, the door 122 remains stored in the door storage unit while the wafer carrier 120 is loaded and/or otherwise moved into the multi-cassette storage buffer 111.

In some embodiments, the wafer carrier or cassette 120 is transported by a transport tool (e.g., a vehicle of an OHT system) to the MCLP apparatus 110 and a hoist on-board the transport tool sets the cassette 120 down upon the table or stage 112 from above, i.e., along the −Z direction. As shown, the multi-cassette storage buffer 111 has an input/output gateway 119 facing the back side of the wafer carrier 120. In practice, the table or stage 112 is movable relative to the housing of the multi-cassette storage buffer 111. In some embodiments, a controller 113 may control the table or stage 112 to selectively move the wafer carrier 120 through the gateway 119 and into the multi-cassette storage buffer 111 (i.e., along the −X direction) to load the cassette 120 into the storage buffer 111. In accordance with various embodiments, the controller 113 may be disposed under the table/stage 112 (as shown in FIG. 1) or disposed within the housing of the storage buffer 111, or disposed at other places of the MCLP apparatus 110. The controller 113 may be electrically and/or mechanically connected to the table/stage 112 for controlling the table/stage 112.

In some embodiments, an Equipment Front End Module (EFEM) 300 (as shown in FIG. 3) is suitably coupled to the MCLP 110 for: (a) retrieving at least one wafer from a cassette 120 whose door has been opened/removed and stored in the door storage system 118 and which cassette 120 has subsequently been loaded into the storage buffer 111; and (b) transferring the retrieved wafer to a chamber 502 of a wafer processing tool 500 (as shown in FIG. 3). In practice, the processing tool 500 to which the wafer is transferred by the EFEM 300 may be a manufacturing apparatus (for example, a deposition chamber, etch chamber, lithographic exposure scanner, developer tool, or so forth), a visual inspection apparatus, an electrical characteristic test apparatus, etc.

In some embodiments, after the tool 500 is finished with a wafer, the wafer may be returned to its cassette 120 within the storage buffer 111, e.g., by the EFEM 300. In turn, a next wafer may likewise be retrieved by the EFEM 300 from a cassette 120 loaded in the storage buffer 111, transferred by the EFEM 300 to the processing tool 500, processed accordingly, and returned by the EFEM 300 to its cassette 120. This may be repeated and/or continued thusly for each wafer in turn. Once all (or some other portion of) the wafers from a given cassette 120 within the storage buffer 111 have been suitably processed by the processing tool 500 and returned to the cassette 120, the controller 113 may control the table/stage 112 to unload the wafer carrier 120 from the storage buffer 111, e.g., via the gateway 119.

In some embodiments, after the wafer carrier 120 is unloaded from the storage buffer 111 to the table/stage 112, the door opening/closing mechanism 116 is configured to retrieve a door from the door storage system 118. The retrieved door may be the original door 122 of the wafer carrier 120 before the wafer carrier 120 was loaded into the storage buffer 111, or may be another door the same model or type as the original door 122 to fit the wafer carrier 120. In practice, the door opening/closing mechanism 116 may hold and move down the retrieved door (i.e., along the −Z direction) from the corresponding door storage unit and re-attach and/or close the retrieved door onto the wafer carrier 120, e.g. by a latch key and vacuum hole. The OHT system may then retrieve the unloaded and re-closed wafer carrier 120 from the table/stage 112 and transport it away, e.g., to another load port or tool for further processing of the one or more semiconductor wafers in the wafer carrier 120.

In some embodiments, the multi-cassette storage buffer 111 of the MCLP apparatus 110 includes multiple buffering spaces that are movably disposed in the storage buffer 111, e.g., via a suitable elevator or other like mechanism. For wafer carrier loading, the controller 113 may first control the plurality of buffering spaces to selectively move up or down (i.e., along the Z or −Z direction), such that an unoccupied one of the buffering spaces is aligned with the table/stage 112 and/or gateway 119. The controller 113 may then control the table/stage 112 to move the wafer carrier 120 through the gateway 119 and into an aligned buffering space (i.e., along the −X direction) to load the wafer carrier 120 into the aligned buffering space of the storage buffer 111.

One or more opened cassettes having been loaded in the storage buffer 111, the EFEM 300 coupled to the MCLP apparatus 110 may in turn selectively retrieve and return wafers therefrom (i.e., from cassettes whose doors have been opened/removed and which are buffered/stored in the plurality of buffering spaces in the storage buffer 111).

For wafer carrier unloading of the MCLP apparatus 110, after the tool 500 finishes processing one or more wafers in turn and they have been returned to an opened wafer carrier 120 in the storage buffer 111 (e.g., by the EFEM 300), the controller 113 may control the table/stage 112 to unload the wafer carrier 120 from its buffering space through the gateway 119. In practice, it is to be understood that since there may be multiple wafer carriers 120 stored and/or buffered in the buffering spaces of the storage buffer 111 at any given time (e.g., waiting for wafer processing), the previously aligned buffering space may be misaligned with the table/stage 112 and/or gateway 119. In this case, the controller 113 may first control the buffering spaces to selectively move up or down (e.g., along the Z or −Z direction) to realign the previously aligned buffering space with the table/stage 112 and/or gateway 119, before controlling the table/stage 112 to unload the wafer carrier 120 from the realigned buffering space.

In accordance with the embodiment shown in FIG. 1, the storage buffer 111 including the plurality of buffering spaces is located at the back side of the wafer carrier 120, from an operator's point of view when the operator is standing in front of the MCLP apparatus 110 and facing the door storage system 118. In this case, the table/stage 112 is configured to move the wafer carrier 120 into a buffering space from front to back, from the operator's point of view.

Figure 2A:
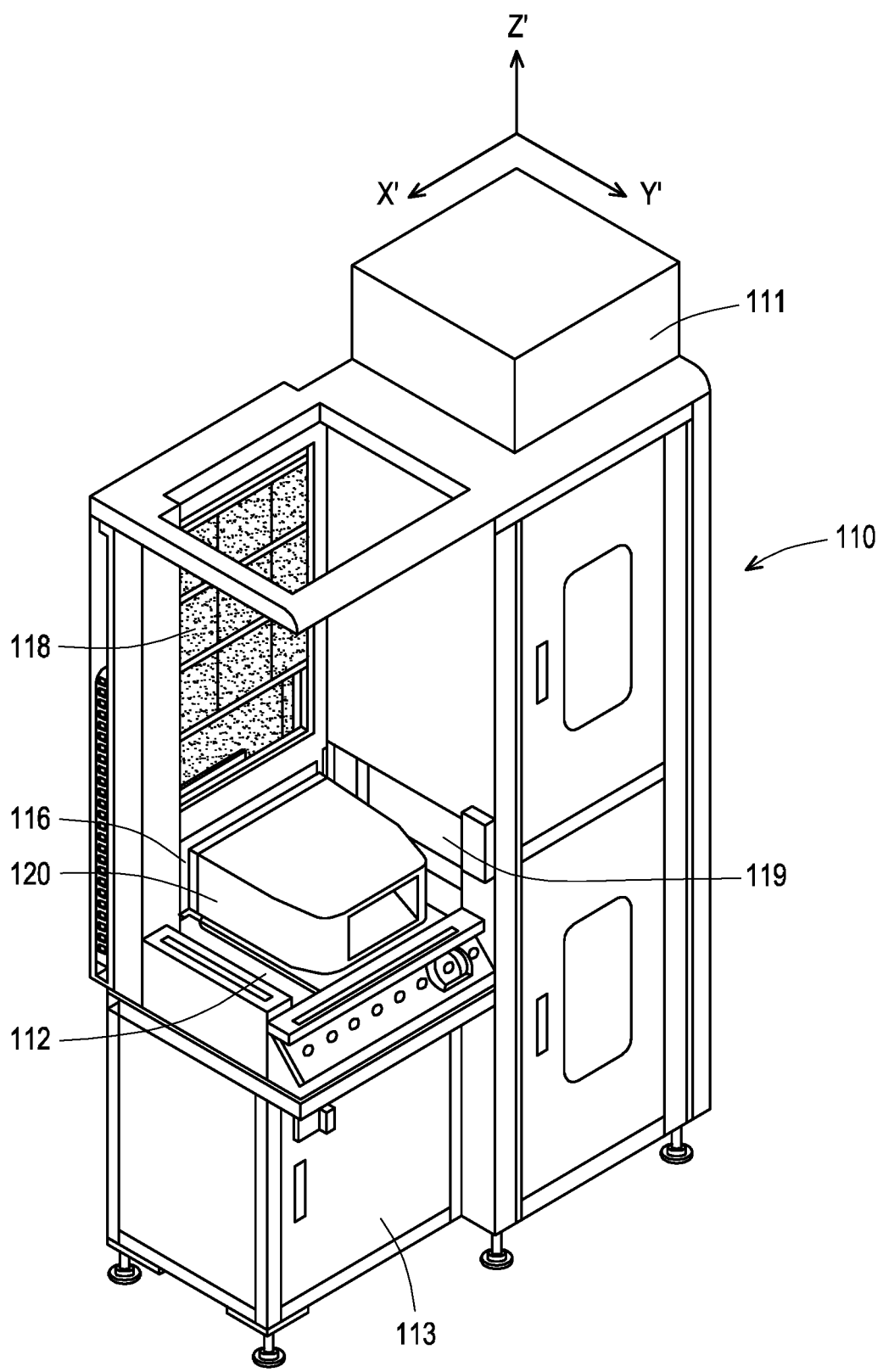
FIG. 2A diagrammatically illustrates a front perspective view of a multi-cassette load port apparatus in accordance with some alternate embodiments disclosed herein.
Figure 2B:
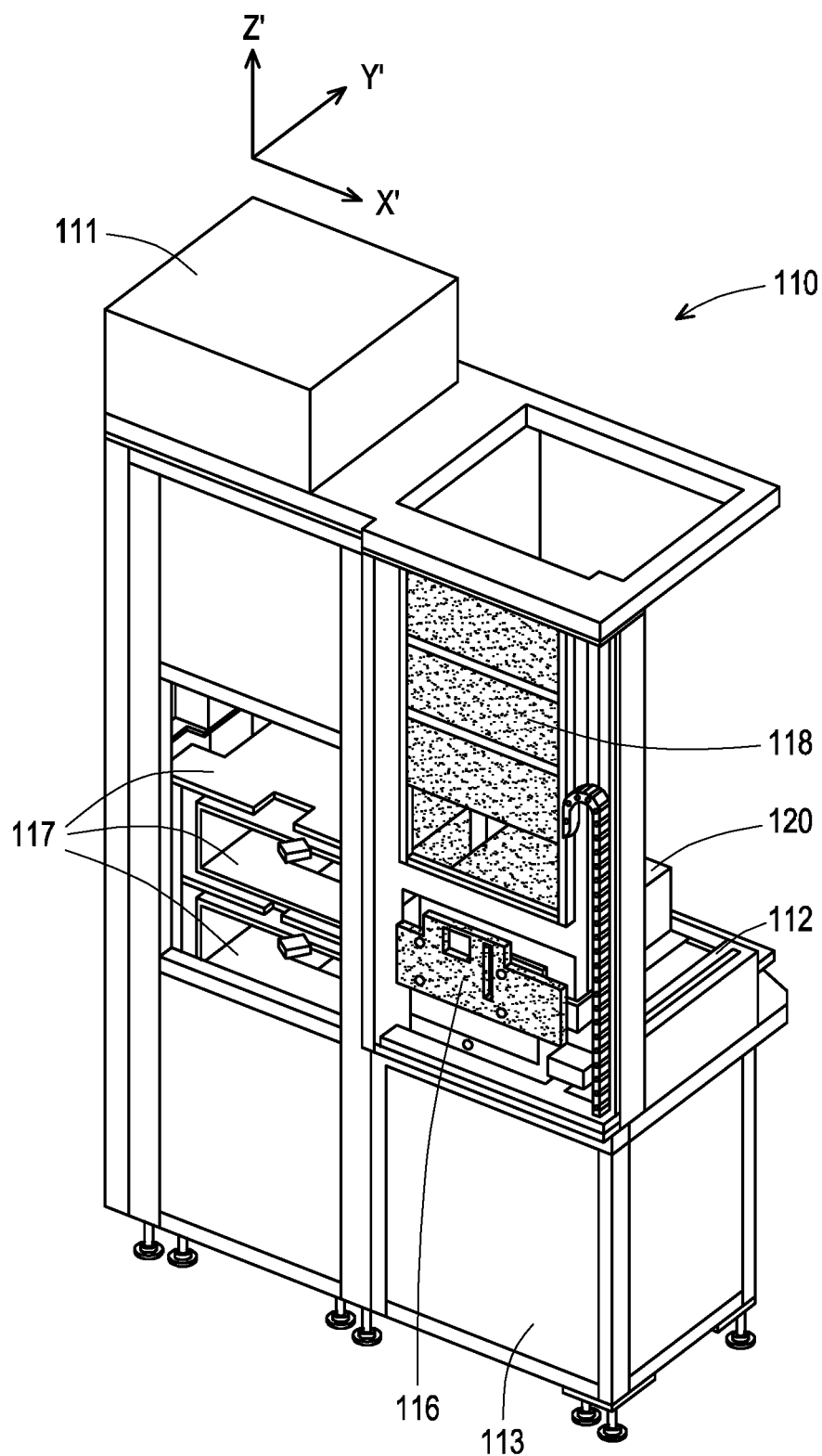
FIG. 2B diagrammatically illustrates a back perspective view of the multi-cassette load port apparatus shown in FIG. 2A.

FIG. 2A illustrates a front perspective view of another MCLP apparatus 110 in accordance with some embodiments of the present disclosure. FIG. 2B illustrates a corresponding back perspective view of the MCLP apparatus 110 shown in FIG. 2A. Generally, the MCLP 110 shown in FIGS. 2A and 2B has a corresponding array of parts, components and/or elements similar to that shown in FIG. 1, and operates in essentially the same manner as described above and elsewhere herein. However, the orientation of the MCLP 110 as shown in FIGS. 2A and 2B is different from the orientation shown in FIG. 1. That is to say, the MCLP apparatus 110 of FIGS. 2A and 2B can be considered as a side-loading MCLP apparatus 110 (i.e., from an operator's viewpoint), while the MCLP apparatus of FIG. 1 can be considered as a front-loading MCLP apparatus 110 (i.e., from an operator's viewpoint).

As shown in FIGS. 2A and 2B, the table/stage 112 is configured to receive a wafer carrier 120 with its door (not shown in FIGS. 2A and 2B) on the back of the wafer carrier 120, i.e. on the side facing the door storage system 118. The door storage system 118 and the door opening/closing mechanism 116 in this example extend from and/or are coupled to a corner of the housing of the storage buffer 111, i.e., at a left-back corner (as view in FIG. 2A) of the storage buffer 111 and extending therefrom generally in the X direction relative to the storage buffer 111. In this case, the door opening/closing mechanism 116 is configured to open and/or remove the door of the wafer carrier 120 (e.g. by a latch key and vacuum hole) and move the door away from the wafer carrier 120 toward the back of the wafer carrier 120 (i.e., along the −Y direction as shown in FIGS. 2A and 2B). The door opening/closing mechanism 116 may then hold the door and move it up along the Z direction to the door storage system 118 where the door may be selectively stored in a door storage unit while the cassette 120 is loaded into the storage buffer 111.

In this example, the gateway 119 to the storage buffer 111 is arranged on the left side (as viewed in FIG. 2A) of the storage buffer housing and faces the right side of the wafer carrier 120. Accordingly, in this example, the table/stage 112 is configured to selectively move the cassette 120 sideways (i.e., in the −X and/or X directions) to selectively load and/or retrieve the cassette 120 into and/or out of an aligned buffering space of the storage buffer 111, e.g., under the direction and/or control of the controller 113.

In the embodiment of FIGS. 2A and 2B, the EFEM 300 may be coupled to a rear or backside of the MCLP apparatus 110 for selectively retrieving and/or returning wafers (via an opening in the rear or backside of the storage buffer 111) from and/or to a wafer carrier 120, whose door has been opened/removed and stored in the door storage system 118, while the wafer carrier 120 is loaded and/or resides in a buffering space 117 of the storage buffer 111.

In accordance with the embodiment shown in FIGS. 2A and 2B, the storage buffer 111 including the plurality of buffering spaces 117 is located at the right side of the wafer carrier 120 (as viewed in FIG. 2A), from an operator's point of view when the operator is standing in front of the MCLP apparatus 110 and facing the door storage space 118. In this case, for loading, the table/stage 112 is configured to selectively move the wafer carrier 120 through the gateway 119 into an aligned buffering space 117 from left to right, from the operator's point of view. Alternately, it is to be understood that in some other embodiments, the storage buffer 111 of the MCLP apparatus 110, including buffering spaces, may be located at the left side of the wafer carrier 120, and for loading, the table/stage 112 is configured to move the wafer carrier 120 into an aligned buffering space from right to left, from the operator's point of view. That is to say, in some embodiments, the MCLP apparatus 110 may be configured and/or arranged essentially as a mirror image of what is shown in FIGS. 2A and 2B.

As shown in FIG. 3, a vehicle 200 of an OHT system selectively delivers and retrieves cassettes 120 from the table/stage 112 of the MCLP apparatus 110. In the illustrated embodiment, the storage buffer 111 of the MCLP apparatus 110 is shown loaded with a plurality of cassettes 120a, 120b, 120c and 120d. While four cassettes are illustrated for purposes of this example, in practice, the storage buffer 111 may accommodate more or less than four cassettes.

In some embodiments, the EFEM 300 is coupled to the MCLP apparatus 110 such that a robot 302 of the EFEM 300 may in turn selectively retrieve and return a selected wafer 400 from and to a selected cassette within the storage buffer 111. For example, the robot 302 of the EFEM 300 is shown retrieving the wafer 400 from the cassette 120b. Having retrieved the wafer 400, the EFEM 300 (e.g., via robot 302) transfers the wafer 400 to and/or places the wafer 400 in the chamber 502 of the tool 500. After processing, testing and/or inspection of the wafer 400 is completed by the tool 500, the EFEM 300 retrieves the wafer 400 from the chamber 502 of the tool 500 and returns the wafer 400 to its cassette within the storage buffer 111 of the MCLP apparatus 110.

In general, the EFEM 300 is provided, programmed and/or otherwise provisioned with positional information and/or data (i.e., referred to herein as nominal wafer position data) indicating an expected nominal location of the wafer 400. In some embodiments, the EFEM 300 and/or robot 302 uses the nominal wafer position data, at least in part, to accurately retrieve the wafer 400 from a respective cassette in the storage buffer 111 and accurate deliver and/or place the wafer 400 to and/or in the chamber 502 of the tool 500.

However, in practice, the wafer 400 may not strictly conform to or reside in the nominal location indicated by the nominal wafer position data. That is to say, in practice, the actual wafer location may from time-to-time vary from the nominal wafer location. For example, in practice, during various transport steps or otherwise, the wafer 400 may in fact have laterally shifted in some direction (e.g., in the X-Y or horizontal plane) away from the nominal location. For example, such a shift may be experienced by the wafer 400 when a tolerance or other like allowance in the dimensions and/or configuration of the cassette in which it is carried do not exactly limit or precisely fix the location of the wafer 400 within the respective cassette. Additionally, a naturally or otherwise occurring warpage in the wafer 400, for example, may result in the wafer 400 (or a warped portion thereof) not precisely conforming to the nominal location in the vertical direction (i.e., in the direction of the Z axis). That is to say, should the wafer 400 (or a warped portion thereof) not be strictly planar, then in actuality the effective height or vertical location over the surface of the wafer (e.g., in the Z direction) may differ from the corresponding nominal location. Accordingly, employing only the nominal wafer position data for the purpose of regulating wafer handling by the EFEM 300 can result in a misalignment that has the potential to cause damage to a wafer so handled by the EFEM 300, e.g., when loading and/or placing the wafer 400 within the chamber 502 of the tool 500.

Therefore, in accordance with some embodiments disclosed herein, the MCLP apparatus 110 is provisioned, equipped and/or configure with a compensation system that sends or otherwise provides wafer location off-set data to the EFEM 300, which wafer location off-set data (along with the nominal wafer location data) may then be used by the EFEM 300 to account, correct and/or compensate for wafer variation from the nominal wafer location, e.g., in regulating wafer handling by the robot 302, thereby alleviating potential misalignments.

As shown in FIG. 3, the compensation system includes a wafer position sensor 600 that measures and/or detects a position or location of the semiconductor wafer 400. In some embodiments, the sensor 600 is located, contained and/or otherwise arranged within the storage buffer 111 of the MCLP apparatus 110 (i.e., within the housing of the storage buffer 111, see also FIG. 4), e.g., so as not to increase an overall collective footprint of the tools and/or machinery on the floor of the FAB.

In practice, the wafer position sensor 600 is an optical sensor that is arranged and/or positioned toward a top end of the storage buffer 111 (i.e., in the Z direction) and aimed, pointed or otherwise oriented vertically downward, e.g., normal to a horizontal plane and/or transfer path of the wafer 400 (i.e., normal to the X-Y plane in the illustrated embodiments), to capture within its Field-of-View (FoV) 602 the wafer 400. In some embodiments, the sensor 600 may be oriented plus or minus 30 degrees from normal to allow flexibility in the design of the MCLP apparatus 110 and/or flexibility in the placement of the sensor 600 within the storage buffer 111. The sensor 600 is positioned, aimed and/or oriented with a FoV 602 interposed between the opened door side of the cassettes 120a, 120b, 120c and 120d held in the storage buffer 111 and the EFEM 300 and/or the robot 302 thereof.

In some embodiments, the sensor 600 obtains three-dimensional (3D) position information and/or data according to the measured or detected location of the wafer 400 within a FoV 602. In some embodiments, the position sensor 600 is an optical sensor (e.g. employing a camera, a raster laser beam, a linear array of light emitting diodes (LEDs) or laser diodes, various combinations thereof, or so forth). For example, the optical wafer position sensor may be a machine vision (MV) sensor and may include any one or more of an area camera, a pair of stereo vision cameras, a line scanner and/or a laser displacement sensor. For example, in some embodiments, an area camera may obtain or capture a two-dimensional (2D) image of the entire wafer 400 within the FoV 602. In some alternate embodiments, a line scanner may obtain or capture a 2D image of the wafer 400 line-by-line as the wafer 400 passes through the FoV 602. Suitably, in some embodiments, a laser displacement sensor measures or otherwise detects the depth or displacement of the wafer 400 (e.g., along the Z direction), for example using measurement of pulsed laser time-of-flight interval or coherent light phase shift of reflected light, such that a corresponding surface profile or depth map may be created or derived, at least in part, therefrom. In some alternate embodiments, the sensor 600 employs a pair of stereo cameras from which 3D image data may be obtained. In some embodiments, the sensor 600 can be comprised of various combinations of any one or more of the foregoing configurations to obtain a 3D measurement and/or detection of the wafer's location or position.

In some embodiments, an amount and/or direction of wafer warpage (i.e., warpage of the wafer 400 in the Z and/or -Z directions) and/or an amount and/or direction of wafer shift (i.e., shift of the wafer 400 along a direction within the X-Y plane) is calculated from and/or based at least in part on the information and/or data captured and/or obtained by the position sensor 600. For example, the warpage and shift of the wafer 400 away from the nominal location may be calculated from, at least in part, the 3D location data and/or information obtained by the position sensor 600. In some suitable embodiments, a wafer warpage of greater than or equal to about 1000 um may be detected and/or calculated. In some suitable embodiments, a wafer shift of greater than or equal to about 0.5 mm may be detected and/or calculated.

In some embodiments, the calculated and/or otherwise obtained warpage and/or shift of the wafer 400 (e.g., which describes a potential variation of the wafer's location and/or position relative to an expected nominal wafer location and/or position) may then be converted into and/or otherwise used to derive the aforementioned wafer location off-set data that is sent and/or provided to the EFEM 300. In some embodiments, this conversion and/or derivation provides the wafer location off-set data in a coordinate system recognized and/or used by the EFEM 300. In some suitable embodiments, the received wafer location off-set data is employed by the EFEM 300, at least in part, to further regulate or control operation of the robot 302 handling the wafer 400 and thereby alleviate potential misalignments that could result in damage to the wafer 400, e.g., when the robot 302 loads and/or places the wafer 400 in the chamber 502 of the tool 500. That is to say, the wafer location off-set data is used by the EFEM 300 to account, correct and/or compensate for wafer variation from the nominal wafer location, e.g., in regulating and/or controlling the wafer handling by the robot 302.

Figure 4:
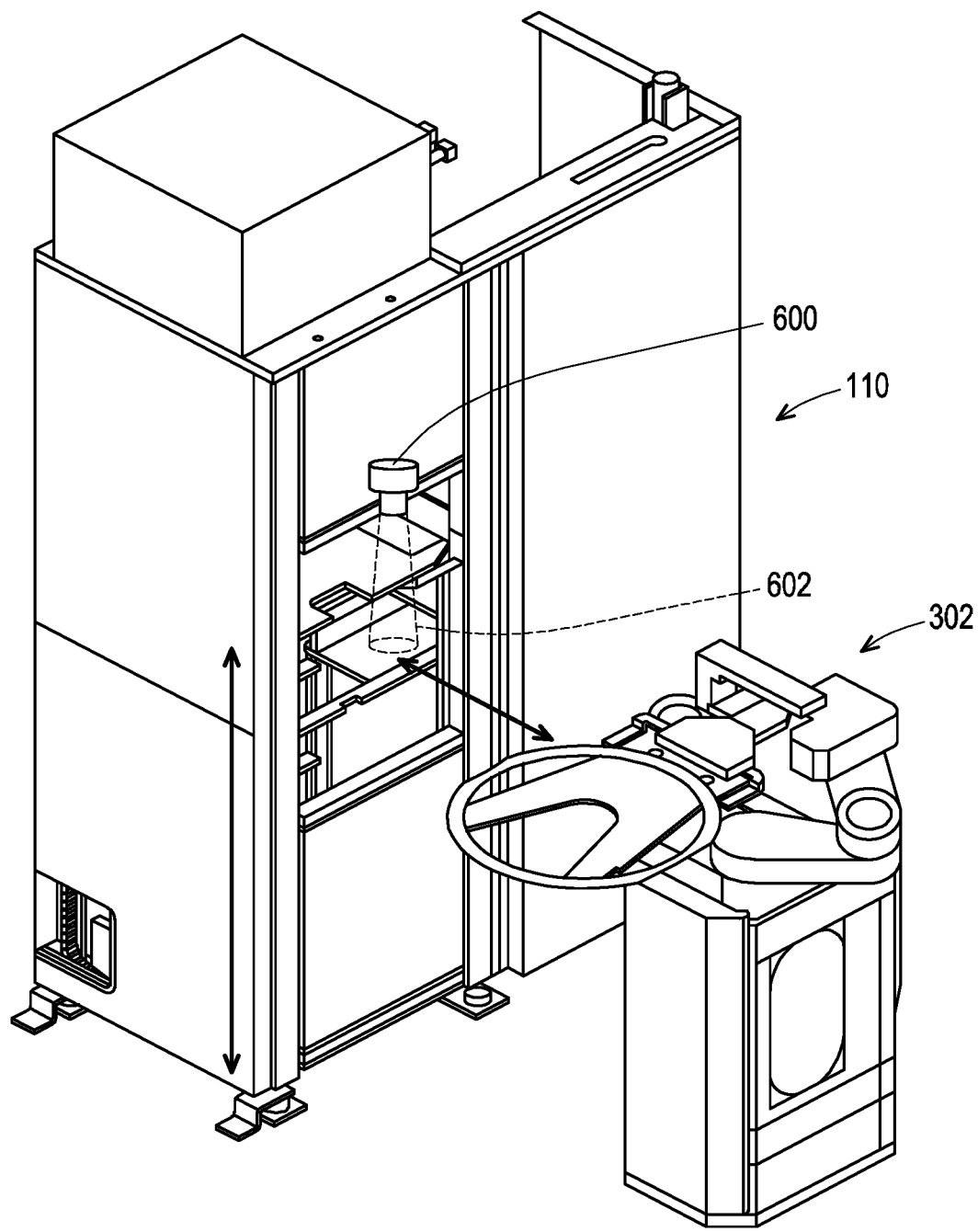
FIG. 4 diagrammatically shows a perspective view of a multi-cassette load port apparatus with a position sensor disposed therein and a robot for wafer handling.

With reference to FIG. 4, an advantage of the disclosed approach in which the optical wafer position sensor 600 is disposed inside the MLCP apparatus 110 is reduced footprint of the assembly. In this regard, while diagrammatic FIG. 4 shows the optical wafer position sensor 600 for illustration purposes, in the actual assembly the sensor 600 may be disposed inside the MLCP apparatus 110 and hence occluded from view (as shown in diagrammatic FIG. 3). As seen in the perspective view of FIG. 4, the FoV 602 at which the optical measurement of the wafer position is performed may also be disposed inside the MLCP apparatus 110. With this arrangement, the wafer position (e.g. lateral shift and/or warpage) is measured before the wafer is handled by the robot 302 and placed into the tool 500 (see FIG. 3). By communicating the wafer position information to the robot 302 or other wafer-handling apparatus (more generally, Equipment Front End Module or EFEM 300) before complex wafer handling, the robot 302 can be programmed to accommodate the wafer shift and/or warpage so as to ensure precise placement of the wafer in the tool 500, thereby improving wafer handling precision and reducing likelihood of wafer damage due to mishandling by the robot 302.

Figure 5:
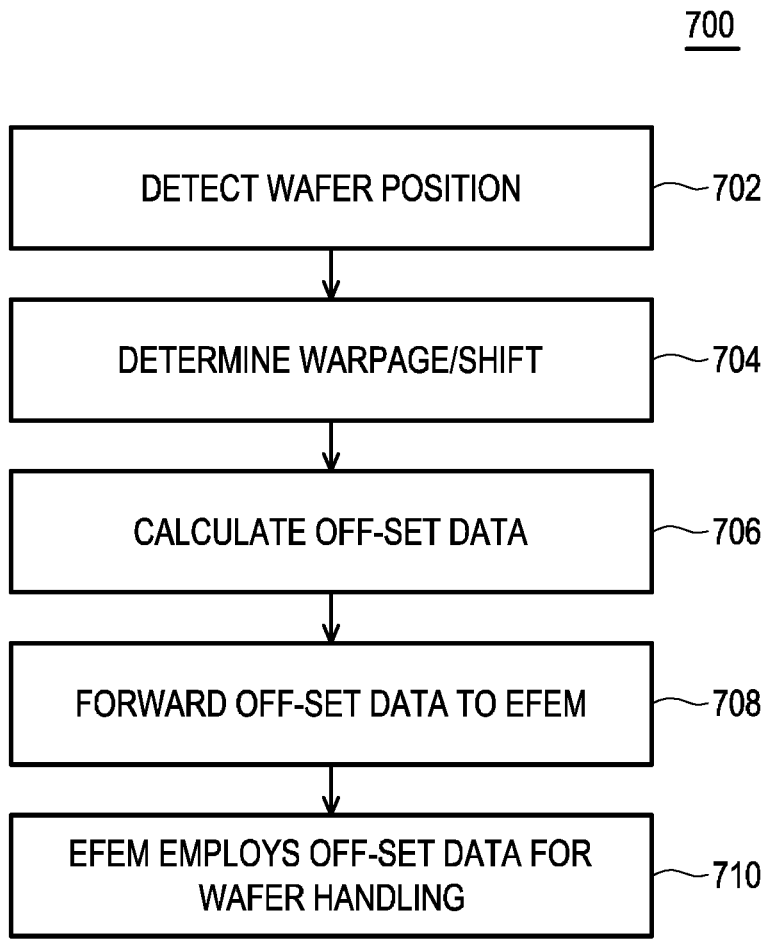
FIG. 5 is a flow chart showing wafer position compensation method in accordance with some embodiments disclosed herein.

With reference now to FIG. 5, the illustrated flow chart shows an method and/or process 700, e.g., carried out by the aforementioned compensation system, in accordance with some embodiments disclosed herein.

As shown, in step 702, the sensor 600 measures or otherwise detects the 3D position the wafer 400 within the FoV 602.

As shown, in step 704, the warpage and/or shift of the wafer 400 (e.g., describing or reflecting the warpage (e.g., in the Z and/or -Z directions) and/or shift (e.g., in the X-Y plane) of the wafer 400 from a nominal wafer position or location) is calculate or otherwise determined, at least in part, with, from and/or based upon the measurements obtained in step 702.

As shown, in step 706, wafer location off-set data is calculated or otherwise determined, at least in part, with, from and/or based up the warpage and/or shift arrived at in step 704. Suitably, the wafer location off-set data describes or reflects, in a coordinate system recognized and/or employed by the EFEM 300, the warpage and/or shift of the wafer 400 from the nominal wafer position, e.g., which nominal wafer position is otherwise expected by the EFEM 300.

As shown, in step 708, the wafer location off-set data is sent or provided to the EFEM 300.

As shown, in step 710, the EFEM 300 uses the received wafer location off-set data, at least in part, to regular and/or control handling of the wafer 400 by the robot 302, e.g., for the loading and/or placement of the wafer 400 in the chamber of the tool.

Measurement of both the lateral shift and warpage of the wafer advantageously provides wafer location offset data in both lateral (e.g. X- and/or Y-) and vertical (e.g. Z-) directions, thereby providing maximum information for adjusting the handling of the wafer by the EFEM 300. However, in certain situations only the lateral shift, or only the warpage, may be measured. As an example of a situation in which warpage measurement might be omitted, early in the fabrication process the wafer may have few or no layers deposited thereon. Since warpage is often caused by deposition of a different material on the wafer (e.g., due to differential thermal expansion between the deposited material and the silicon or other wafer material; or in the case of epitaxial deposition due to lattice mismatch, as examples) it may be unnecessary to measure wafer warpage when transferring the wafer early in the fabrication process. Similarly, if the wafer diameter is small then warpage may be assumed to be negligible. An example of a situation in which lateral offset measurement might be omitted is if the robot 302 and the tool 500 are designed to accommodate a significant wafer offset so that some offset error is unlikely to cause an issue.

In some embodiments, the controller 113 may be in operative communication with the sensor 600 and EFEM 300 and may be programmed and/or otherwise provisioned to implement the functions carried out by compensation system and/or to execute the process 700. In some alternate embodiments, the compensation system may employ a separate controller. In some embodiments, the compensation system controller may be housed remotely or elsewhere, e.g., outside the MCLP apparatus 110.

In some embodiments, the controller 113 and/or compensation system controller may be implemented via hardware, software, firmware or a combination thereof. In particular, one or more controllers may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

In the following, some further illustrative embodiments are described.

In some embodiments, a method of a handling semiconductor wafers in a space of a semiconductor wafer processing facility includes: loading a cassette containing at least one semiconductor wafer into a storage buffer of a load port; measuring, from within the storage buffer using an optical sensor disposed in the storage buffer, a position of a selected at least one semiconductor wafer being retrieved from the cassette residing in the storage buffer; and determining, at least in part based on said measuring, a variation of the position of the selected semiconductor wafer from a nominal position.

In some further embodiments, the method further includes communicating the determined variation to an equipment front end module coupled to the load port, such that the equipment front end module controls its handling of the selected semiconductor wafer, at least in part, based on the determined variation.

In still additional embodiments, the variation comprises variation of the position of the selected semiconductor wafer from the nominal position in at least three dimensions.

In some embodiments, the determining comprises at least one of: determining a warpage of the selected semiconductor wafer in a first direction; and determining a shifting of the selected semiconductor wafer in a second direction within a plane normal to the first direction.

In yet further embodiments, the method further includes converting the determined variation to wafer location off-set data that is communicated to an equipment front end module, such that the equipment front end module controls its handling of the selected semiconductor wafer, at least in part, based on the wafer location off-set data.

In some further embodiments, the location off-set data represents, in a coordinate system recognized by the equipment front end module, the determined variation.

In some embodiments, the measuring is performed by a machine vision sensor housed within the storage buffer of the load port.

In yet further embodiments, the machine vision sensor comprises at least one of an area camera, a pair of stereo cameras, a line scanner and a laser displacement sensor.

In some embodiments, the machine vision sensor is aimed normal to a travel path followed by the selected semiconductor wafer as it is being retrieve from the cassette.

In some further embodiments, the machine vision sensor is aimed in a range of plus or minus 30 degrees to normal of a travel path followed by the selected semiconductor wafer as it is being retrieve from the cassette.

In still further embodiments, the machine vision sensor has a field-of-view interposed between the cassette loaded into the storage buffer of the load port and a robot of an equipment front end module coupled to the load port for transferring the selected semiconductor wafer to a chamber of a tool in which the selected semiconductor wafer is to be processed.

In yet additional embodiments, a method of compensating for a semiconductor wafer varying in position from an otherwise expected nominal location is provided. The method includes: holding at least one cassette in a storage buffer, said at least one cassette carrying at least one semiconductor wafer therein; detecting, from within the storage buffer, a position of a selected at least one semiconductor wafer being retrieve from the at least one cassette held in the storage buffer; and determining, at least in part based on said detected position, a variation of the selected semiconductor wafer from the nominal location In some further embodiments, the determining comprises: determining a first variation of the selected semiconductor wafer in a first direction; and determining a second variation of the selected semiconductor wafer in a second direction within a plane normal to the first direction.

In some additional embodiments, the method further includes determining wafer location off-set data based, at least in part, on the first and second variations.

In some embodiments, the method further includes sending the wafer location off-set data to an equipment front end module, such that the equipment front end module controls a robot's handling of the selected semiconductor wafer subsequent to the equipment front end module receiving the wafer location off-set data, at least in part, based on the received wafer location off-set data.

In some embodiments, the detecting is performed by a sensor having a field-of-view interposed between the at least one cassette held in the storage buffer and the robot.

In some further embodiments, the sensor is housed within the storage buffer.

In still further embodiments, a load port for staging semiconductor wafers includes: a storage buffer that holds at least one cassette, the at least one cassette carrying at least one semiconductor wafer therein; and a sensor that detects a position of a selected at least one semiconductor wafer being retrieved by a robot from the at least one cassette, the sensor being contained in the storage buffer. Suitably, a variation in a position of the selected semiconductor wafer from a nominal position is determine by the load port, at least in part, based on the position detected by said sensor.

In yet further embodiments, the position detected by the sensor is a three-dimensional position.

In still one more embodiment, the at least one cassette includes a plurality of cassettes; the storage buffer includes a plurality of buffering spaces, each buffering space accommodating one of the plurality of cassettes; and the storage buffer is configured to selectively move the plurality of buffering spaces in order to align a selected one of the plurality of buffering spaces with a gateway through which cassettes are selectively loaded into the storage buffer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of a handling semiconductor wafers in a space of a semiconductor wafer processing facility, said method comprising:
    loading a cassette containing at least one semiconductor wafer into a storage buffer of a load port;
    measuring, from within the storage buffer using an optical sensor disposed in the storage buffer, a position of a selected at least one semiconductor wafer being retrieved from the cassette residing in the storage buffer;
    determining, at least in part based on said measuring, a variation of the position of the selected semiconductor wafer from a nominal position; and
    communicating the determined variation to an equipment front end module coupled to the load port, such that the equipment front end module controls its handling of the selected semiconductor wafer, at least in part, based on the determined variation.

2. The method of claim 1, wherein said variation comprises variation of the position of the selected semiconductor wafer from the nominal position in at least three dimensions.

3. The method of claim 1, wherein said determining comprises at least one of:
    determining a warpage of the selected semiconductor wafer in a first direction; and
    determining a lateral shift of the selected semiconductor wafer in a second direction within a plane normal to the first direction.

4. The method of claim 1, further comprising:
    converting the determined variation to wafer location off-set data that is communicated to an equipment front end module, such that the equipment front end module controls its handling of the selected semiconductor wafer, at least in part, based on the wafer location off-set data.

5. The method of claim 4, wherein the location off-set data represents, in a coordinate system recognized by the equipment front end module, the determined variation.

6. The method of claim 1, wherein said measuring is performed by a machine vision sensor housed within the storage buffer of the load port.

7. The method of claim 6, wherein the machine vision sensor comprises at least one of an area camera, a pair of stereo cameras, a line scanner and a laser displacement sensor.

8. The method of claim 6, wherein the machine vision sensor is aimed normal to a travel path followed by the selected semiconductor wafer as it is being retrieve from the cassette.

9. The method of claim 6, wherein the machine vision sensor is aimed in a range of plus or minus 30 degrees to normal of a travel path followed by the selected semiconductor wafer as it is being retrieved from the cassette.

10. The method of claim 6, wherein the machine vision sensor has a field-of-view interposed between the cassette loaded into the storage buffer of the load port and a robot of an equipment front end module coupled to the load port for transferring the selected semiconductor wafer to a chamber of a tool in which the selected semiconductor wafer is to be processed.

11. A method of compensating for a semiconductor wafer varying in position from an otherwise expected nominal location, said method comprising:
    holding at least one cassette in a storage buffer, said at least one cassette carrying at least one semiconductor wafer therein;
    detecting, from within the storage buffer, a position of a selected at least one semiconductor wafer being retrieved from the at least one cassette held in the storage buffer; and
    determining, at least in part based on said detected position, a variation of the selected semiconductor wafer from the nominal location,
    wherein said determining comprises determining a first variation of the selected semiconductor wafer in a first direction; and determining a second variation of the selected semiconductor wafer in a second direction within a plane normal to the first direction.

12. The method of claim 11, further comprising:
determining a wafer location off-set data based, at least in part, on the first and second variations.

13. The method of claim 12, further comprising:
sending the wafer location off-set data to an equipment front end module, such that the equipment front end module controls a robot's handling of the selected semiconductor wafer subsequent to the equipment front end module receiving said wafer location off-set data, at least in part, based on the received wafer location off-set data.

14. The method of claim 13, wherein said detecting is performed by an optical sensor having a field-of-view interposed between the at least one cassette held in the storage buffer and the robot.

15. The method of claim 14, wherein the optical sensor is housed within the storage buffer.

16. A load port for staging semiconductor wafers, said load port comprising:
a storage buffer that holds at least one cassette, the at least one cassette carrying at least one semiconductor wafer therein; and
a sensor that detects a position of a selected at least one semiconductor wafer being retrieved by a robot from the at least one cassette, said sensor being contained in the storage buffer;
wherein a variation in a position of the selected semiconductor wafer from a nominal position is determined by the load port, at least in part, based on the position detected by said sensor,
wherein the at least one cassette includes a plurality of cassettes;
wherein the storage buffer includes a plurality of buffering spaces, each buffering space accommodating one of the plurality of cassettes; and
wherein the storage buffer is configured to selectively move the plurality of buffering spaces in order to align a selected one of the plurality of buffering spaces with a gateway through which cassettes are selectively loaded into the storage buffer.

17. The load port of claim 16, wherein the position detected by the sensor is a three-dimensional position.

18. The load port of claim 16, wherein the determined variation is communicated to an equipment front end module coupled to the load port, such that the equipment front end module controls its handling of the selected semiconductor wafer, at least in part, based on the determined variation.

19. The load port of claim 16, wherein the determined variation is determined by at least one of:
determining a warpage of the selected semiconductor wafer in a first direction; and
determining a lateral shift of the selected semiconductor wafer in a second direction within a plane normal to the first direction.

20. The load port of claim 16, wherein the determined variation is converted to wafer location off-set data that is communicated to an equipment front end module, such that the equipment front end module controls its handling of the selected semiconductor wafer, at least in part, based on the wafer location off-set data.

* * * * *